(12) United States Patent
Sanada et al.

(10) Patent No.: US 6,749,351 B2
(45) Date of Patent: Jun. 15, 2004

(54) APPARATUS FOR DEVELOPING SUBSTRATE

(75) Inventors: Masakazu Sanada, Kyoto (JP); Masahiko Harumoto, Kyoto (JP)

(73) Assignee: Dainippon Screen Mfg. Co. Ltd. (JP)

( * ) Notice: Subject to any disclaimer, the term of this patent is extended or adjusted under 35 U.S.C. 154(b) by 0 days.

(21) Appl. No.: 10/330,883

(22) Filed: Dec. 26, 2002

(65) Prior Publication Data

US 2003/0118341 A1 Jun. 26, 2003

(30) Foreign Application Priority Data

Dec. 26, 2001 (JP) ................................. P2001-393293
Aug. 29, 2002 (JP) ................................. P2002-251102

(51) Int. Cl.$^7$ .............................................. G03D 5/00
(52) U.S. Cl. ...................... 396/604; 396/611; 396/627; 118/52; 118/319; 427/420; 134/902
(58) Field of Search .................... 396/604, 611, 396/627; 118/52, 54, 319; 427/240

(56) References Cited

U.S. PATENT DOCUMENTS 6,092,937 A 7/2000 Snodgrass et al.

FOREIGN PATENT DOCUMENTS

| JP | 1020508 | 1/1998 |
|---|---|---|
| JP | 10340836 | 12/1998 |
| JP | 11221511 | 8/1999 |

OTHER PUBLICATIONS

English translation of Abstract for Japanese Application Laid–Open No. 11–221511 (1999).
English translation of Abstract for Japanese Application Laid–Open No. 10–20508 (1998).
English translation of Abstract for Japanese Application Laid–Open No. 10–340836 (1998).

*Primary Examiner*—D. Rutledge
(74) *Attorney, Agent, or Firm*—Ostrolenk, Faber, Gerb & Soffen, LLP

(57) ABSTRACT

A developer supply nozzle moves from a first end toward a second end of a substrate for supplying a developer to the overall main surface of the substrate. After a lapse of a required developing time, a rinse discharge nozzle moves from the first end toward the second end of the substrate for supplying a rinse to the overall main surface of the substrate. A partition plate is provided for preventing the rinse discharged from a slit discharge port of the rinse discharge nozzle onto the substrate from flowing frontward in the direction of movement of the rinse discharge nozzle or washing away the developer supplied onto the substrate frontward.

14 Claims, 5 Drawing Sheets

F I G . 3
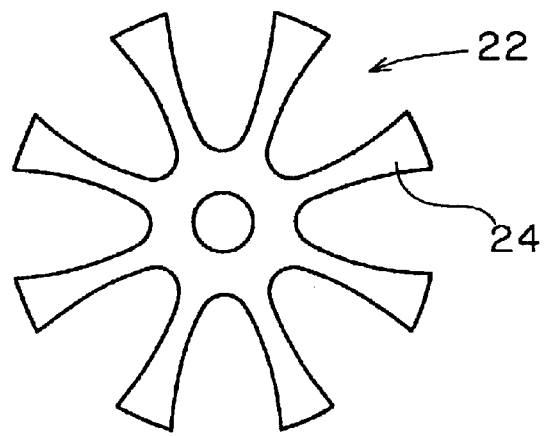
F I G . 4
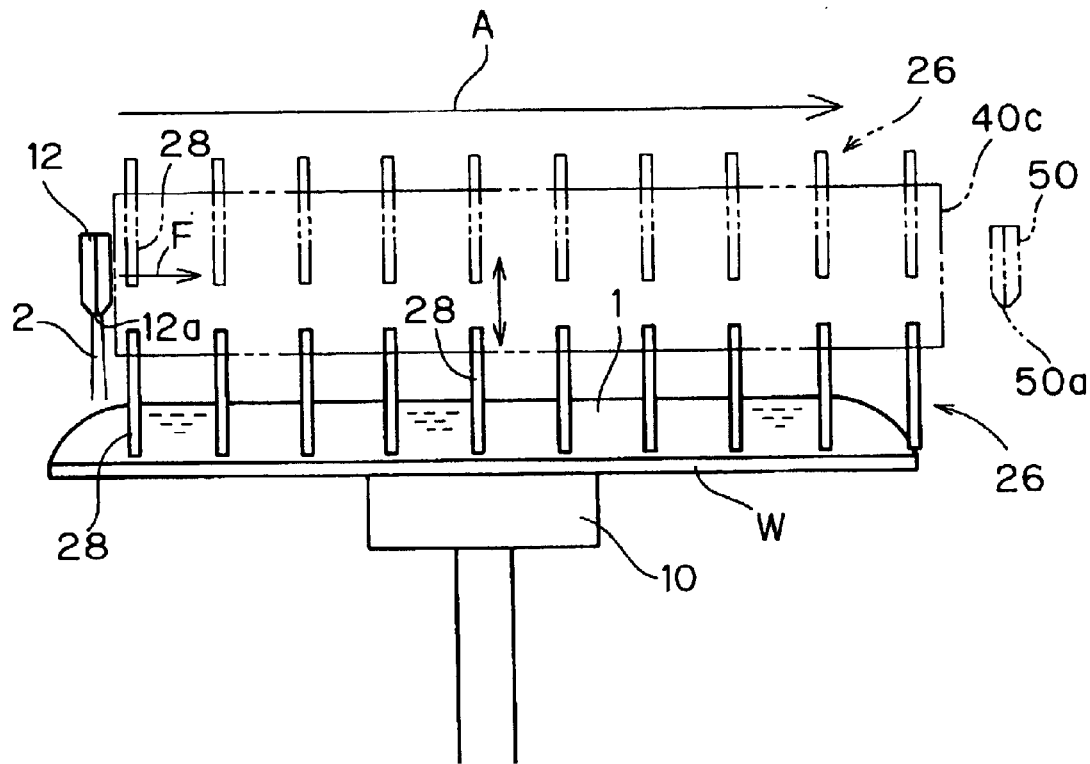

APPARATUS FOR DEVELOPING SUBSTRATE

BACKGROUND OF THE INVENTION

1. Field of the Invention

The present invention relates to an apparatus for developing an exposed photoresist film formed on the surface of a substrate such as a semiconductor wafer, a glass substrate for a liquid crystal display, a glass substrate for a photomask or a substrate for an optical disk by supplying a developer thereto.

2. Description of the Background Art

In a manufacturing process for a semiconductor device, for example, a slit scan development system has recently been widely employed as a method of developing a photoresist film formed on the surface of a substrate such as a semiconductor wafer. This development system is employed for horizontally linearly moving a developer discharge nozzle having a slit discharge port equivalent to or longer by about several mm than the diameter of the substrate from a first end to a second end of the substrate stationarily horizontally held by a substrate holding part and discharging a developer onto the substrate from the slit discharge port of the developer discharge nozzle for heaping the developer on the substrate, as disclosed in Japanese Patent Laying-Open Gazette No. 11-221511 (1998), for example. When the developer is heaped on the stationary substrate, line width uniformity of a resist film pattern can be remarkably improved.

When the developer discharge nozzle is moved at a speed of 50 mm/sec., for example, in this slit scan development, a substrate of 300 mm in diameter cause developing time difference of 6 seconds at the maximum. In a developing time of about 60 seconds applied in a conventional manufacturing process, development reaction of photoresist substantially converges and hence no work dimension difference exceeding allowance results from the developing time difference caused in the substrate plane. In manufacturing of a recent semiconductor device, however, a hyperfine working technique has been fully put to use and the work dimension allowance has been strictly managed. Therefore, work dimension difference resulting from developing time difference, causing substantially no problem in general, may come into question as the case may be. When the developing time is reduced for improving the throughput, the work dimension difference resulting from the developing time difference disadvantageously remarkably appears.

In order to eliminate developing time difference in a substrate plane, there has recently been proposed a scan rinsing system of providing a rinse discharge nozzle also with a slit discharge port for supplying a rinse (deionized water) onto a substrate for stopping development reaction and moving the rinse discharge nozzle at the same speed and in the same direction as a developer discharge nozzle after holding a prescribed developing time after the developer discharge nozzle heaps a developer on the substrate for discharging the rinse onto the substrate from the slit discharge port of the rinse discharge nozzle.

When a developer discharge nozzle (not shown) heaps a developer 1 on the overall upper surface of a substrate W horizontally held by a substrate holding part 10 so that a rinse discharge nozzle 12 thereafter horizontally moves from a first end to a second end of the substrate W for discharging a rinse 2 onto the substrate W from a slit discharge port thereof as shown in FIG. 8A, however, the rinse 2 discharged from the rinse discharge nozzle 12 flows also frontward along the direction of movement of the rinse discharge nozzle 12, as shown in FIG. 8B. Further, the part of the rinse 2 flowing frontward beyond the rinse discharge nozzle 12 washes away part of the developer 1 located in front of the rinse discharge nozzle 12. Therefore, it follows that development reaction is stopped in front of the rinse discharge nozzle 12 before movement thereof. Consequently, developing time difference in the plane of the substrate W cannot be effectively eliminated, and work dimension difference resulting from the developing time difference cannot be eliminated either.

SUMMARY OF THE INVENTION

The present invention is directed to a substrate processing apparatus supplying a developer to a substrate for performing development and thereafter supplying a rinse for stopping the development.

A developing apparatus according to the present invention comprises a substrate holding element substantially horizontally holding a substrate, a developer supply element having a slitlike first discharge port discharging a developer for relatively moving in a first horizontal direction with respect to the substrate and discharging the developer onto the substrate from the first discharge port thereby obtaining a puddle of developer covering the overall upper surface of the substrate, a rinse supply element having a slitlike second discharge port discharging a rinse for relatively moving in the first horizontal direction with respect to the substrate and discharging the rinse onto the substrate from the second discharge port thereby stopping development with the puddle of developer and an anti-flow element preventing a first stream of the rinse, discharged onto the substrate from the second discharge port, flowing frontward in the first horizontal direction and a second stream formed by the puddle of developer washed away by the rinse frontward in the first horizontal direction.

When the developer supply element heaps the developer on the overall upper surface of the substrate held by the substrate holding element and the rinse supply element thereafter discharges the rinse onto the substrate from the slit discharge port while relatively moving in the same direction as the developer supply element with respect to the substrate, the rinse discharged from the slit discharge port neither flows frontward in the direction of relative movement of the rinse supply element nor washes away the developer heaped on the substrate frontward. Therefore, development reaction is not stopped in front of the rinse supply element before movement thereof, whereby developing time difference in the substrate plane can be eliminated.

Accordingly, an object of the present invention is to eliminate development time difference in a substrate plane for eliminating working dimension difference resulting from the development time difference when performing slit scan development/slit scan rinsing.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a front elevational view showing another exemplary structure of a partition roller provided in the substrate developing apparatus according to the second embodiment shown in FIG. 2;

FIG. 4 is a schematic front elevational view showing a principal part of a substrate developing apparatus according to a third embodiment of the present invention;

DESCRIPTION OF THE PREFERRED EMBODIMENTS

Figure 1:
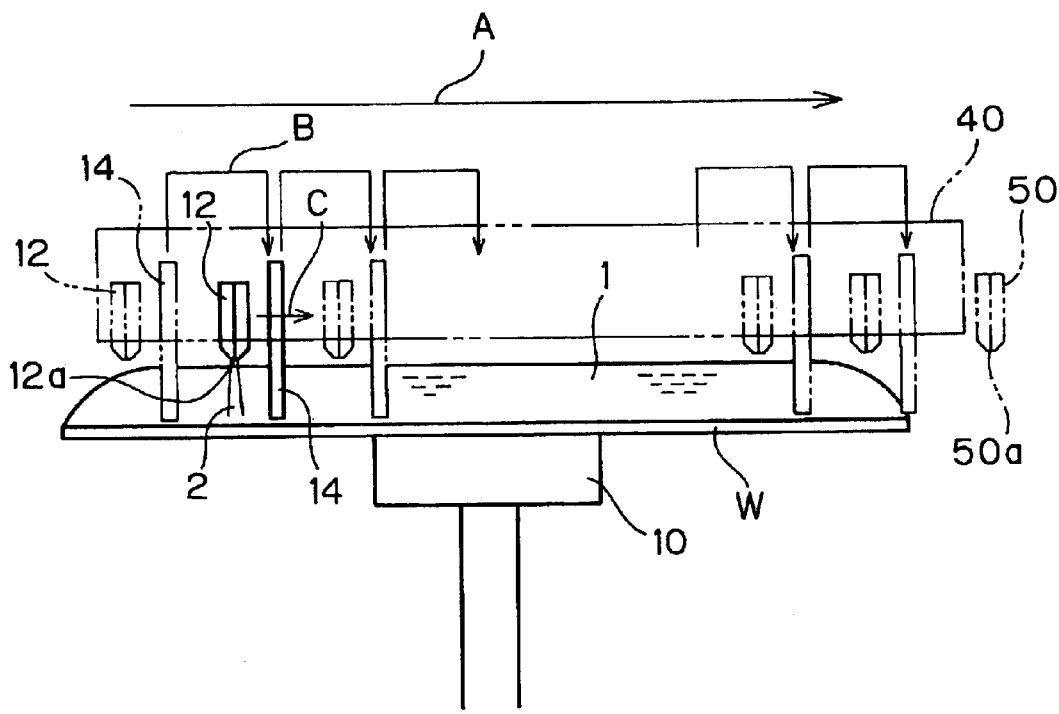
FIG. 1 is a schematic front elevational view showing the structure of a principal part of a substrate developing apparatus according to a first embodiment of the present invention.

FIG. 1 is a schematic front elevational view showing the structure of a principal part of a substrate developing apparatus according to a first embodiment of the present invention. Referring to FIG. 1 (this also applies to FIGS. 2 and 4 to 6), illustration of a rotation mechanism for a substrate, a developing cup and the like is omitted and detailed description thereof is also omitted.

Referring to FIG. 1, a developer discharge nozzle 50 having a slit discharge port 50a equivalent to or longer by several mm than the diameter of a substrate W on its lower end horizontally linearly moves from a first end to a second end of the substrate W such as a semiconductor wafer horizontally held by a substrate holding part 10 and discharges a developer 1 onto the substrate W from the slit discharge port 50a for heaping the developer 1 on the overall upper surface of the substrate W and forming a puddle of developer. Arrow A in FIG. 1 denotes the scanning direction of the developer discharge nozzle 50.

This developing apparatus comprises a rinse discharge nozzle 12 having a slit discharge port 12a equivalent to or longer by several mm than the diameter of the substrate W on its lower end. The rinse discharge nozzle 12 is arranged in the same direction as the developer discharge nozzle 50, and supported by a supporting/moving mechanism to move from the first end to the second end of the substrate W in a direction (the same direction as the scanning direction A of the developer discharge nozzle 50) perpendicular to the slit discharge port 12a. The rinse discharge nozzle 12 discharges a rinse 2 such as deionized water onto the substrate W from the slit discharge port 12a, for stopping development with the developer 1 heaped on the substrate W.

The apparatus shown in FIG. 1 also comprises a partition plate 14 serving as a movable blocking device and a supporting/moving mechanism 40 therefor. The partition plate 14 is arranged to be perpendicular to the direction of movement of the rinse discharge nozzle 12, i.e., in parallel with the rinse discharge nozzle 12. The partition plate 14 has a small width and a large length, so that the longitudinal dimension thereof is equivalent to or larger than the diameter of the substrate W and the vertical width is sufficiently larger than the thickness of the developer 1 heaped on the substrate W. The supporting/moving mechanism 40 formed by a drive mechanism employing a motor or an air cylinder supports and moves the partition plate 14 to vertically move between a lower position where the lower end thereof approaches the upper surface of the substrate W until the interval between the same and the substrate W (more correctly, a photoresist film formed on the substrate W) is 0.1 mm to 0.5 mm and an upper position where the lower end is pulled up from the developer 1 heaped on the substrate W and to horizontally move in the same direction as the direction of movement of the rinse discharge nozzle 12 by a distance smaller than the diameter of the substrate W on the upper position. The partition plate 14 moves downward so that the lower end thereof is introduced into the developer 1 heaped on the substrate W from above, thereby keeping back the developer 1. The rinse discharge nozzle 12 intermittently horizontally moves following the horizontal movement of the partition plate 14 due to the supporting/moving mechanism therefor.

In order to perform rinsing after the developer discharge nozzle 50 heaps the developer 1 on the overall upper surface of the substrate W in the developing apparatus having the aforementioned structure, the rinse discharge nozzle 12 and the partition plate 14 are located on a starting point side in the scanning direction A of the developer discharge nozzle 50 so that the partition plate 14 moves downward until the lower end thereof approaches the upper surface of the substrate W on a position slightly moving from the first end of the substrate W in the scanning direction A as shown by two-dot chain lines, for introducing the lower end of the partition plate 14 into the developer 1 heaped on the substrate W. In this state, the rinse discharge nozzle 12 discharges the rinse 2 from the slit discharge port 12a. At this time, the partition plate 14 keeps back the front side of the developer 1 heaped on the substrate W, thereby preventing the rinse 2 discharged from the slit discharge port 12a of the rinse discharge nozzle 12 from flowing frontward or washing away the developer 1 heaped on the substrate W frontward.

The rinse discharge nozzle 12 stops discharging the rinse 2 after a prescribed time, and then the partition plate 14 moves up along arrow B from the developer 1 heaped on the substrate W, horizontally moves by a small distance in the same direction as the scanning direction A of the developer discharge nozzle 50 and thereafter moves downward again until the lower end thereof approaches the upper surface of the substrate W as shown by solid lines, for introducing the lower end of the partition plate 14 into the developer 1 heaped on the substrate W. Further, the rinse discharge nozzle 12 intermittently horizontally moves by a small distance in the same direction as the scanning direction A of the developer discharge nozzle 50 following the horizontal movement of the partition plate 14, as shown by arrow C. In this state, the rinse discharge nozzle 12 discharges the rinse 2 again from the slit discharge port 12a. Also at this time, the partition plate 14 keeps back the front side of the developer 1 heaped on the substrate W, thereby preventing the rinse 2 discharged from the slit discharge port 12a of the rinse discharge nozzle 12 from flowing frontward or washing away the developer 1 heaped on the substrate W frontward.

The rinse discharge nozzle 12 stops discharging the rinse 2 after a prescribed time, and then the partition plate 14 moves up from the developer 1 heaped on the substrate W for repeating the aforementioned operations. When the rinse discharge nozzle 12 and the partition plate 14 move to an end point side in the scanning direction A of the developer discharge nozzle 50 to stop all development with the developer 1 heaped on the substrate W, the developing apparatus ends the series of rinsing.

In the aforementioned series of operations, the repetitive step numbers of the movement of the partition plate 14 along arrow B, the movement of the rinse discharge nozzle 12 along arrow C and the discharge of the rinse 2 are decided by the distance of single horizontal movement of the partition plate 14 and the distance thereof is so decided that work dimension difference resulting from developing time difference caused in a range corresponding to the distance is within an allowable range, while the same is preferably minimized. The average speed of the horizontal movement of the rinse discharge nozzle 12 is set substantially identical to the speed of the horizontal movement of the developer discharge nozzle 50.

Figure 2:
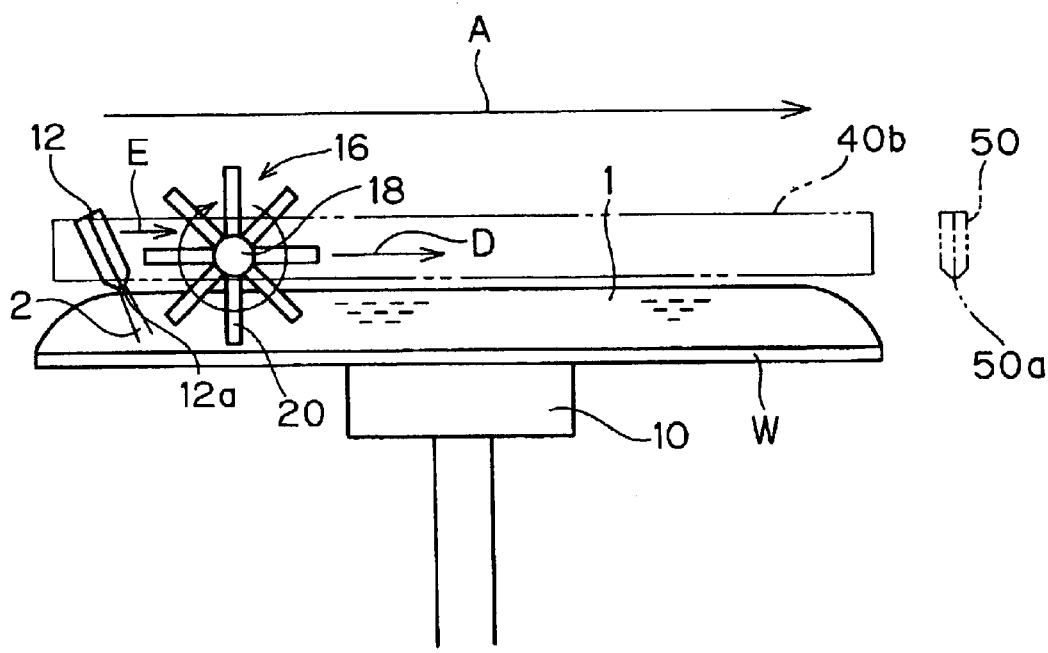
FIG. 2 is a schematic front elevational view showing a principal part of a substrate developing apparatus according to a second embodiment of the present invention.
Figure 5:
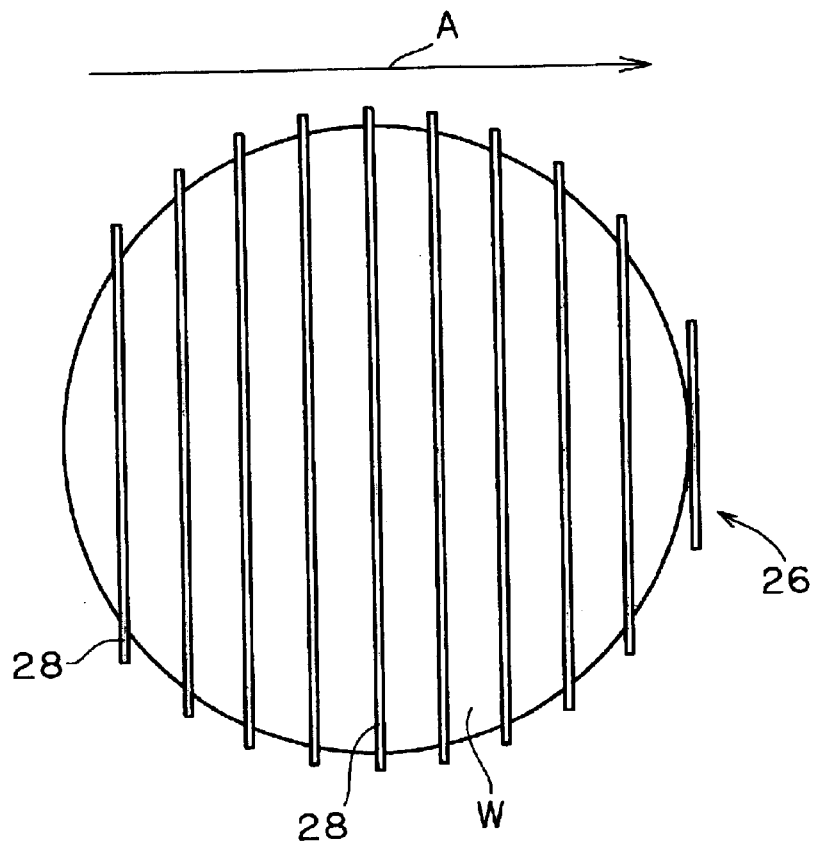
FIG. 5 is a schematic plan view of the principal part of the substrate developing apparatus show in FIG. 4.

FIG. 2 is a schematic front elevational view showing a principal part of a substrate developing apparatus according to a second embodiment of the present invention. This developing apparatus comprises a partition roller (bladed wheel) 16 arranged above a substrate W held by a substrate holding part 10 as a blocking device. In the second embodiment and third and fourth embodiments described later, redundant description is omitted as to elements similar to those of the aforementioned first embodiment.

The partition roller 16 is formed by radially fixing a plurality of partition plate parts (plate-shaped blades) 20 having a longitudinal dimension rendered equivalent to or larger than the diameter of the substrate W to a rotary shaft 18. The distance (radius of the partition roller 16) between the center of the rotary shaft 18 of the partition roller 16 and the outer peripheral end of each partition plate part 20 is rendered slightly smaller than the minimum distance between the center of the rotary shaft 18 of the partition roller 16 and the upper surface of the substrate W, e.g., 0.1 mm to 0.5 mm. An axis of this partition roller 16 is arranged to be parallel to the substrate W and perpendicular to the direction (a scanning direction A of a developer discharge nozzle 50) of horizontal movement of the rinse discharge nozzle 12. A supporting/rotating/moving mechanism 40b employing a motor or an air cylinder supports, rotates and moves the partition roller 16 so that the outer peripheral ends of the partition plate parts 20 successively approach the upper surface of the substrate W while horizontally moving in the same direction as the direction of movement of the rinse discharge nozzle 12.

In order to perform rinsing in the developing apparatus having the structure shown in FIG. 2, the rinse discharge nozzle 12 and the partition roller 16 are located on a starting point side in the scanning direction A of the developer discharge nozzle 50, the partition roller 16 rotates so that the outer peripheral ends of the partition plate parts 20 successively approach the upper surface of the substrate W while horizontally moving along arrow D and the rinse discharge nozzle 12 horizontally moves along arrow E following the horizontal movement of the partition roller 16. The speeds of movement of the partition roller 16 and the rinse discharge nozzle 12 are set substantially identical to that of the developer discharge nozzle 50. The rinse discharge nozzle 12 located at the back of the partition roller 16 continuously discharges a rinse 2 onto the substrate W from a slit discharge port 12a. At this time, any partition plate part 20 of the partition roller 16 keeps back the front side of the developer 1 heaped on the substrate W, thereby preventing the rinse 2 discharged from the slit discharge port 12a of the rinse discharge nozzle 12 from flowing frontward or washing away the developer 1 heaped on the substrate W frontward. When the rinse discharge nozzle 12 and the partition roller 16 move to an end point side in the scanning direction A of the developer discharge nozzle 50 to stop all development with the developer 1 heaped on the substrate W, the developing apparatus ends the series of rinsing.

Assuming that r represents the radius of the partition roller 16 in this apparatus, the partition roller 16 horizontally moves by a distance 2πr every rotation, for example. The radius r and the number n of the partition plate parts 20 are so decided that work dimension difference resulting from developing time difference caused in a range corresponding to a distance of horizontal movement of the partition roller 16 after the outer peripheral end of one partition plate part 20 most approaches the upper surface of the substrate W and before the outer peripheral end of the next partition plate part 20 most approaches the upper surface of the substrate W, i.e., a distance 2πr/n assuming that the partition roller 16 horizontally moves by the distance 2πr every rotation, is within an allowable range, while the distance 2πr/n is preferably minimized.

The shape of the partition roller 16 is not particularly restricted so far as the same is radially provided with the plurality of partition plate parts 20. For example, a plurality of partition plate parts 24 may be integrally formed in a partition roller 22, as shown in FIG. 3.

FIG. 4 is a schematic front elevational view showing a principal part of a substrate developing apparatus according to a third embodiment of the present invention. This developing apparatus comprises a partition member 26 arranged above a substrate W held by a substrate holding part 10 as a blocking device. The partition member 26 is formed by arranging a plurality of partition plates 28 at small intervals in the same direction as the direction of movement (scanning direction A of a developer discharge nozzle 50) of a rinse discharge nozzle 12 to be perpendicular to the direction of movement of the rinse discharge nozzle 12 and parallel to each other. As shown in a plan view of FIG. 5, each partition plate 28 has a small width and a large length so that the longitudinal dimension thereof is equivalent to or larger than the dimension on each position of the substrate W in this direction. The vertical width of each partition plate 28 is rendered sufficiently larger than the thickness of a developer 1 heaped on the substrate W. A supporting/moving mechanism 40c supports and moves the partition member 26 to vertically move between a lower position where the lower end of each partition plate 28 approaches the upper surface of the substrate W until the distance therebetween is 0.1 mm to 0.5 mm, for example, and an upper position where the lower end is pulled up from the developer 1 heaped on the substrate W. When the partition member 26 moves downward for introducing the lower end of each partition plate 28 into the developer 1 heaped on the substrate W from above, each partition plate 28 keeps back the developer 1 in a small section.

In order to perform rinsing in the developing apparatus having the structure shown in FIG. 4, the partition member 26 moves from the upper position shown by two-dot chain lines to the lower position shown by solid lines for introducing the lower ends of the partition plates 28 into the developer 1 heaped on the substrate W so that the lower ends of the partition plates 28 approach the upper surface of the substrate W respectively. In this state, the rinse discharge nozzle 12 horizontally moves from a first end to a second end of the substrate W along arrow F above the partition plates 28 while discharging a rinse 2 onto the substrate W from a slit discharge port 12a thereof. The speed of movement of the rinse discharge nozzle 12 is set substantially identical to that of the developer discharge nozzle 50. At this time, each partition plate 28 of the partition member 26 keeps back the developer 1 heaped on the substrate W in a small section, thereby preventing the rinse 2 discharged from the slit discharge port 12a of the rinse discharge nozzle 12 into each small section from flowing frontward beyond the small section or washing away the developer 1 heaped on the substrate W frontward beyond the small section. When the rinsing is terminated, the partition member 26 moves from the lower position to the upper position for pulling up the partition plates 28 from the developer 1 as shown by the two-dot chain lines.

In the apparatus having the aforementioned structure, the number of the partition plates 28 of the partition member 26 is decided by the interval between the partition plates 28 and this interval is so decided that work dimension difference resulting from developing time difference caused in a range corresponding to the interval is within an allowable range, while the same is preferably minimized.

Figure 6:
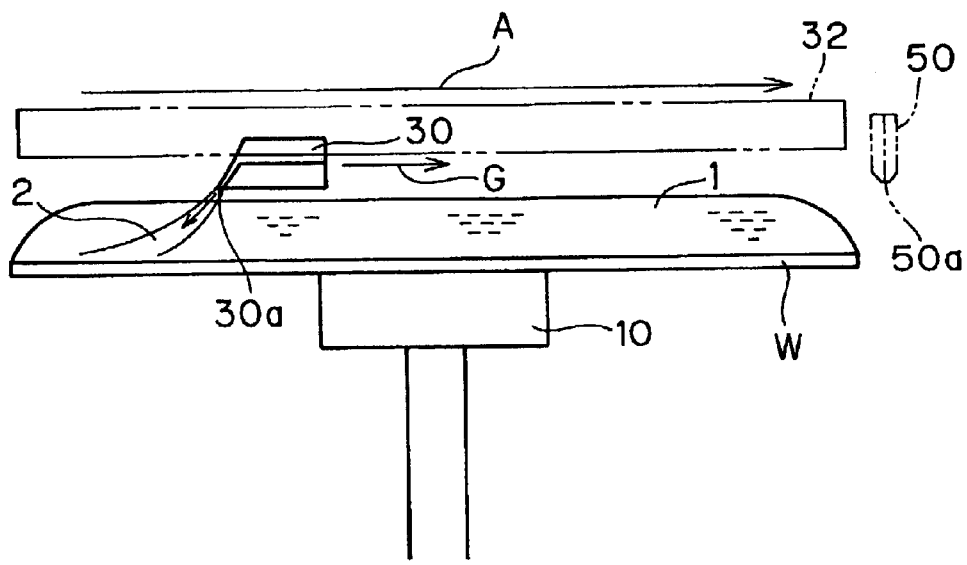
FIG. 6 is a schematic front elevational view showing a principal part of a substrate developing apparatus according to a fourth embodiment of the present invention.

FIG. 6 is a schematic front elevational view showing a principal part of a substrate developing apparatus according to a fourth embodiment of the present invention, which is different from the aforementioned embodiments. This developing apparatus comprises a rinse discharge nozzle 30 having a slit discharge port 30a formed to discharge a rinse 2 to a direction opposite to the direction of movement. A supporting/moving mechanism 32 formed by a drive mechanism employing a motor or an air cylinder supports the rinse discharge nozzle 30 to move from a firs end to a second end of a substrate W. The developing apparatus is further provided with an element (not shown) supplying a flow velocity of 1 m/sec. to 3 m/sec. or more, for example, to the rinse 2 discharged from the slit discharge port 30a of the rinse discharge nozzle 30 such as a pressure pump pressurizing the rinse 2 supplied to the rinse discharge nozzle 30 or a gas feeder mixing a pressurized gas to the rinse 2 supplied to the rinse discharge nozzle 30, for example. The speed of movement of the rinse discharge nozzle 30, which is preferably rendered substantially identical to the speed of movement (e.g., 50 mm/sec.) of a developer discharge nozzle 50, is not particularly restricted. The position of the rinse discharge nozzle 30, which is preferably arranged on a position not coming into contact with a developer 1 heaped on the substrate W, is not restricted either. Further, the rinse discharge nozzle 30, preferably discharging a single fluid such as deionized water, may be of a two-fluid type mixing deionized water with a gas and discharging the mixture in order to reduce the quantity of the deionized water or ensure the flow velocity of the rinse 2.

In order to perform rinsing in the developing apparatus having the structure shown in FIG. 6, the rinse discharge nozzle 30 moves along arrow G in the same direction as a scanning direction A of the developer discharge nozzle 50 and discharges the rinse 2 onto a substrate W through the slit discharge port 30a upon a lapse of a prescribed time after the developer discharge nozzle 50 heaps the developer 1, similarly to the apparatuses according to the aforementioned embodiments. In this apparatus, the rinse discharge nozzle 30 discharges the rinse 2 from the slit discharge port 30a with a flow velocity in a direction opposite to the direction of movement thereof. Even if a vertical linear velocity acts on the developer 1 heaped on the substrate W from the discharged rinse 2, therefore, influence of this vertical linear velocity on the developer 1 is reduced by a horizontal linear velocity opposite to the direction of movement of the rinse discharge nozzle 30. Consequently, the rinse 2 is prevented from flowing frontward beyond the rinse discharge nozzle 30 or washing away the developer 1 heaped on the substrate W frontward beyond the rinse discharge nozzle 30.

A method of setting the flow velocity of the rinse 2 discharged onto the substrate W from the slit discharge port 30a of the rinse discharge nozzle 30 in the aforementioned developing apparatus shown in FIG. 6 is now described in detail with reference to FIG. 7.

Figure 7:
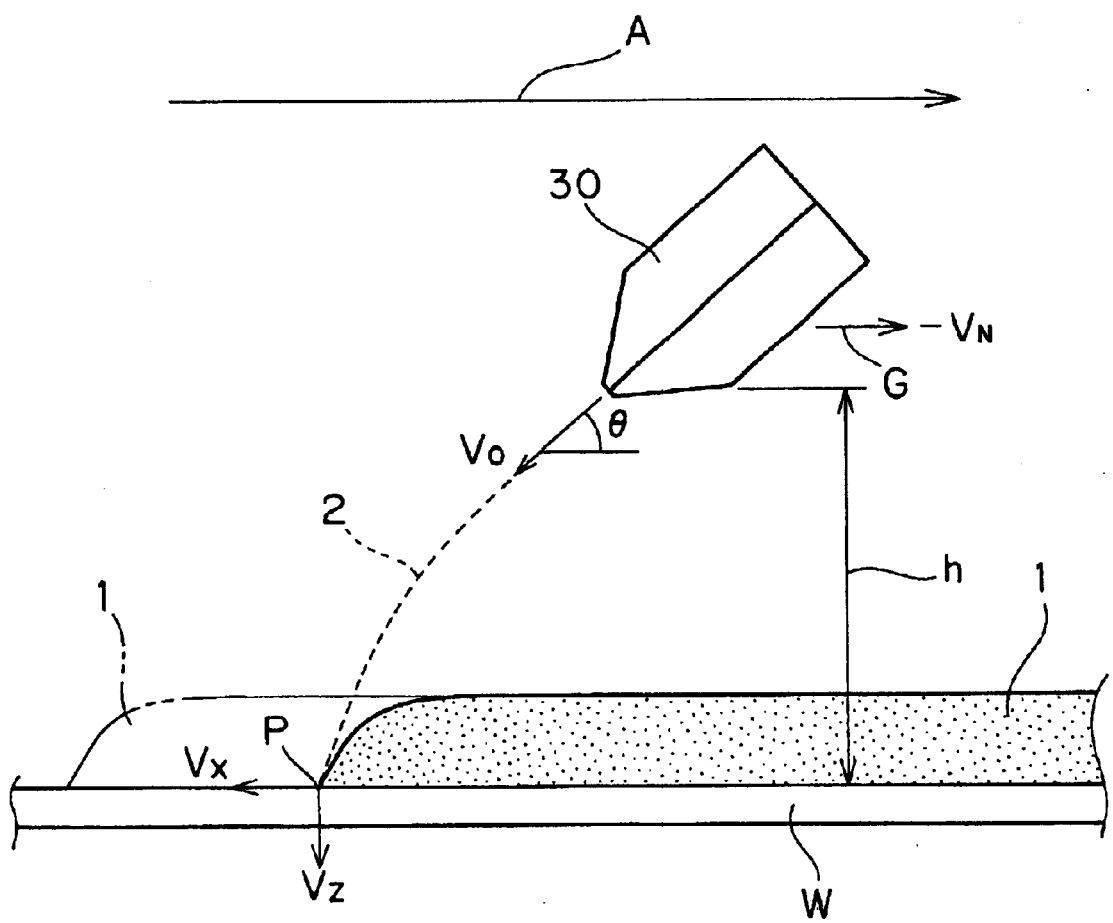
FIG. 7 is a partially enlarged view for illustrating a method of setting a flow velocity of a rinse discharged onto a substrate from a slit discharge port of a rinse discharge nozzle in the substrate developing apparatus shown in FIG. 6.
Figure 8A:
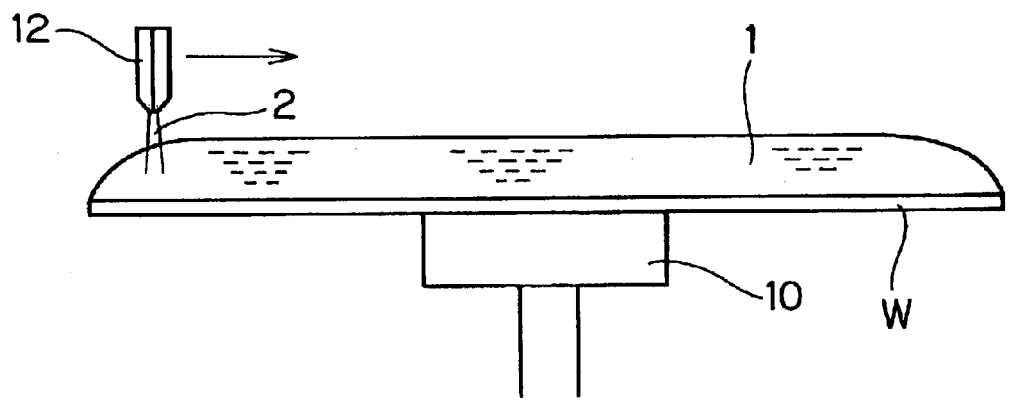
FIG. 8A illustrates a developer heaped on the overall upper surface of a substrate in a conventional developing apparatus.
Figure 8B:
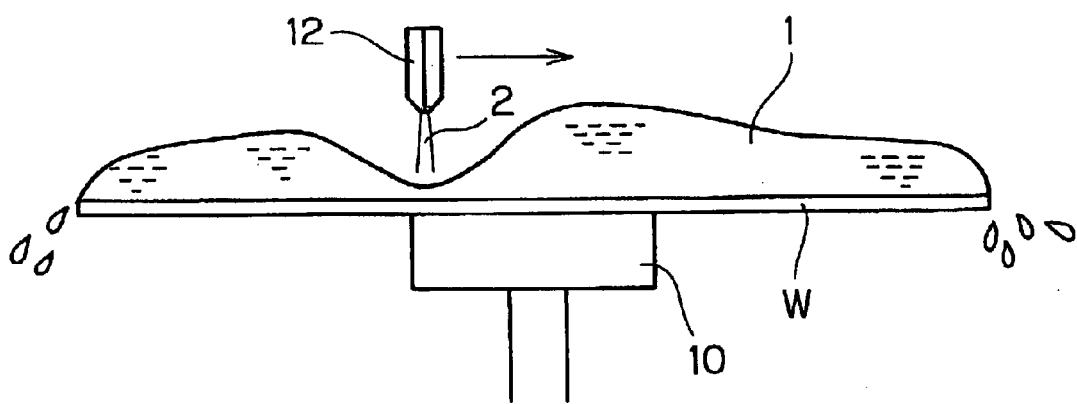
FIG. 8B illustrates a rinse supplied onto the substrate in the conventional developing apparatus.

Assuming that $-V_N$ (it is assumed that + represents the sign for a speed opposite to the direction of movement of the rinse discharge nozzle 30 and $V_N$ represents a positive number) represents the speed of movement of the rinse discharge nozzle 30 along arrow G, h represents the vertical distance between the surface of the substrate W and the slit discharge port 30a of the rinse discharge nozzle 30, $\theta$ ($0° \leq \theta < 90°$) represents the angle formed by the rinse discharge nozzle 30 and a horizontal plane and $V_0$ represents the initial speed of the rinse 2 on the slit discharge port 30a of the rinse discharge nozzle 30 as shown in a partially enlarged sectional view of FIG. 7, an x component (component opposite to the direction of movement of the rinse discharge nozzle 30) Vx and a z component (component vertically downward with respect to the substrate W) Vz of the flow velocity of the rinse 2 on a position P where the rinse 2 discharged from the slit discharge port 30a of the rinse discharge nozzle 30 reaches the substrate W are expressed as follows respectively:

$$Vx = V_0 \cos \theta - V_N$$

$$Vz = V_0 \sin \theta + gt$$

where g represents gravitational acceleration and t represents a time required by the rinse 2 discharged from the slit discharge port 30a of the rinse discharge nozzle 30 for reaching the substrate W, defined by the following equation:

$$h = V_0 \sin \theta + (\tfrac{1}{2})gt^2$$

The position P where the rinse 2 reaches the substrate W can be regarded as a position where the rinse 2 reaches a puddle of the developer 1 on the substrate W. In this case, the x component Vx and the z component Vz of the flow velocity of the rinse 2 are regarded as speed components on a position above the thick distance between the surface of the substrate W and the puddle of the developer layer 1.

As to the discharge mode for the rinse 2, the x component Vx opposite to the direction of relative movement of the rinse discharge nozzle 30 with respect to the substrate W is preferably set to be larger than zero in the relative speed components of the flow velocity of the rinse 2 with respect to the substrate W on the position P where the rinse 2 reaches the substrate W. In other words, the x component Vx is preferably set as follows:

$$Vx = V_0 \cos \theta - V_N > 0$$

Thus, the rinse 2 can be prevented from flowing frontward beyond the rinse discharge nozzle 30 or washing away the developer 1 heaped on the substrate W frontward beyond the rinse discharge nozzle 30, for precisely eliminating developing time difference on each part of the substrate W.

A more preferable mode is as follows:

In general, the speed $V_N$ of movement, the vertical dimension H and the angle $\theta$ of inclination of the rinse discharge nozzle 30 are decided respectively, and hence the initial speed of the rinse 2 is so set that the x component Vx of the flow velocity of the rinse 2 on the position P where the rinse 2 discharged from the slit discharge port 30a of the rinse discharge nozzle 30 reaches the substrate W is equal to or greater than the z component Vz as follows:

$$Vx \geq Vz$$

If the speed $V_N$ of movement, the vertical dimension H and the angle θ of inclination of the rinse discharge nozzle 30 are changeable/adjustable, the speed $V_N$ of movement, the vertical dimension H or the angle θ of inclination of the rinse discharge nozzle 30 is so set that the x component Vx is equal to or greater than the z component Vz as follows:

$$Vx \geq Vz$$

Thus, the rinse 2 can be reliably prevented from flowing frontward beyond the rinse discharge nozzle 30 or washing away the developer 1 heaped on the substrate W frontward beyond the rinse discharge nozzle 30.

While the rinse discharge nozzle 12 and the partition plate 14 (FIG. 1), the rinse discharge nozzle 12 and the partition roller 16 (FIG. 2), the rinse discharge nozzle 12 (FIG. 4) and the rinse discharge nozzle 30 (FIG. 6) horizontally move in the aforementioned embodiments respectively, these may alternatively be fixed for horizontally moving the substrates W. While the partition plate 14, the partition roller 16 and the first partition plates 28 of the partition member 26 are arranged perpendicularly to the directions of movement of the rinse discharge nozzles 12 and 30 in the aforementioned embodiments respectively, these may alternatively be arranged to obliquely intersect with the directions of movement of the rinse discharge nozzles 12 and 30 respectively. Further, the present invention is also applicable to an apparatus structure provided with only a single liquid discharge nozzle for setting a supply pipe system for a developer and a rinse capable of selectively feeding the developer and the rinse to the liquid discharge nozzle thereby sharing the single liquid discharge nozzle for discharging the developer and the rinse.

While the invention has been shown and described in detail, the foregoing description is in all aspects illustrative and not restrictive. It is therefore understood that numerous modifications and variations can be devised without departing from the scope of the invention.

What is claimed is:

1. A developing apparatus comprising:
    a substrate holding element substantially horizontally holding a substrate;
    a developer supply element having a slitlike first discharge port discharging a developer for relatively moving in a first horizontal direction with respect to said substrate and discharging said developer onto said substrate from said first discharge port thereby obtaining a puddle of developer covering the overall upper surface of said substrate;
    a rinse supply element having a slitlike second discharge port discharging a rinse for relatively moving in said first horizontal direction with respect to said substrate and discharging said rinse onto said substrate from said second discharge port thereby stopping development with said puddle of developer; and
    an anti-flow element preventing:
        i) a first stream of said rinse, discharged onto said substrate from said second discharge port, flowing frontward in said first horizontal direction, and
        ii) a second stream formed by said puddle of developer washed away by said rinse frontward in said first horizontal direction.

2. The developing apparatus according to claim 1, wherein
    said anti-flow element has a partition plate introduced into said puddle of developer in advance of movement of said rinse supply element in said first horizontal direction for keeping back said developer.

3. The developing apparatus according to claim 1, wherein
    said anti-flow element includes:
        a partition plate, arranged along a second horizontal direction intersecting with said first horizontal direction, having a lower end introduced into said puddle of developer from above for keeping back said puddle of developer with a width not less than the dimension of said substrate in said second horizontal direction, and
        a moving element supplying said partition plate with relative first and second movements with respect to said substrate for vertically moving said lower end of said partition plate between a lower position approaching said upper surface of said substrate and an upper position pulled up from said puddle of developer through said first movement and relatively horizontally moving said partition plate with respect to said substrate by a prescribed distance, smaller than the dimension of said substrate in said first horizontal direction, in said first horizontal direction on said upper position through said second movement,
    said first movement and said second movement are alternately repeated,
    said rinse supply element intermittently relatively moves with respect to said substrate following said second movement of said partition plate, and
    said second discharge port located at the back of said partition plate discharges said rinse onto said substrate every time said lower end of said partition plate is inserted into said puddle of developer.

4. The developing apparatus according to claim 1, wherein
    said anti-flow element includes:
        a partition roller, arranged in parallel with said substrate along a second horizontal direction intersecting with said first horizontal direction above said substrate, comprising a plurality of radially formed partition plate parts each comprising a lower end, introduced into said puddle of developer from above for keeping back said puddle of developer, having a width not less than the dimension of said substrate in said second horizontal direction, and
        a roller drive element rotating said partition roller so that respective outer peripheral ends of said plurality of partition plate parts successively approach the upper surface of said substrate while relatively moving said partition roller in said first horizontal direction with respect to said substrate,
    so that said partition roller rotates and horizontally moves while said rinse supply element relatively moves with respect to said substrate following horizontal movement of said partition roller for discharging said rinse onto said substrate from said second discharge port located at the back of said partition roller.

5. The developing apparatus according to claim 1, wherein
    said anti-flow element includes:
        a partition member having a plurality of partition plates, arranged along a second horizontal direction intersecting with said first horizontal direction in parallel with each other at an interval smaller than the dimension of said substrate in said first horizontal direction, each having a lower end introduced into said puddle of developer from above for keeping back said puddle of developer with a width not less than the dimension of said substrate in said second horizontal direction, and a moving element relatively vertically moving said lower end of each said partition plate between a lower position approaching said upper surface of said substrate and an upper position pulled up from said puddle of developer, so that said rinse supply element relatively moves with respect to said substrate for discharging said rinse onto said substrate from said second discharge port while said lower end of each of said plurality of partition plates is inserted into said puddle of developer.

6. The developing apparatus according to claim 1, wherein said second discharge port is formed to discharge said rinse in a first opposite direction opposite to said first horizontal direction, and a first component, along said first opposite direction, of the relative speed of said rinse with respect to said substrate is larger than zero on a position where said rinse discharged from said second discharge port reaches said substrate.

7. The developing apparatus according to claim 6, wherein said first component, along said first opposite direction, of the relative speed of said rinse with respect to said substrate is not less than a downward second component of said relative speed on said position where said rinse discharged from said second discharge port reaches said substrate.

8. The developing apparatus according to claim 7, wherein the value of at least one of:
the initial flow velocity of said rinse discharged from said second discharge port,
the speed of relative movement of said rinse supply element with respect to said substrate,
the angle of said rinse discharged from said second discharge port, and
the vertical distance between said upper surface of said substrate and said second discharge port, is so set that said first component is not less than said second component.

9. An apparatus supplying a second liquid to a puddle of a first liquid covering the upper surface of a substantially horizontally held substrate, comprising:

a second liquid supply head supplying said second liquid to said puddle while scanning said puddle; and a blocking device intermittently inserted into said puddle in synchronization with scanning of said second liquid supply head for blocking movement of said puddle resulting from arrival of said second liquid on said puddle.

10. The apparatus according to claim 9, wherein said second liquid supply head scans said puddle following said movement of said blocking device.

11. The apparatus according to claim 10, wherein said blocking device comprises a plate moving step by step along said puddle.

12. The apparatus according to claim 10, wherein said blocking device comprises a bladed wheel moving along said puddle.

13. The apparatus according to claim 9, wherein said blocking device comprises a periodic arrangement of parallel plates.

14. An apparatus supplying a second liquid to a puddle of a first liquid covering the upper surface of a substantially horizontally held substrate, comprising:

a second liquid supply head supplying said second liquid to said puddle causing distortion due to arrival of said second liquid on said puddle; and a drive mechanism making said second liquid supply head supplying said second liquid horizontally scan said substrate along said upper surface of said substrate by supplying such a scanning rate that said distortion of said puddle cannot overtake said scanning of said second liquid supply head.

* * * * *